United States Patent
Kim et al.

(10) Patent No.: US 7,701,793 B2
(45) Date of Patent: *Apr. 20, 2010

(54) SEMICONDUCTOR INTEGRATED CIRCUIT AND METHOD OF OPERATING THE SAME

(75) Inventors: Jin-Young Kim, Seoul (KR); Ki-Whan Song, Yongin-si (KR); Duk-Ha Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 261 days.

This patent is subject to a terminal disclaimer.

(21) Appl. No.: 11/882,931

(22) Filed: Aug. 7, 2007

(65) Prior Publication Data

US 2008/0151665 A1    Jun. 26, 2008

(30) Foreign Application Priority Data

Dec. 22, 2006    (KR) .................. 10-2006-0132902

(51) Int. Cl.
*G11C 7/00* (2006.01)

(52) U.S. Cl. ................... 365/205; 365/206; 365/207

(58) Field of Classification Search ............ 365/205, 365/206, 207
See application file for complete search history.

(56) References Cited

U.S. PATENT DOCUMENTS

| | | | |
|---|---|---|---|
| 6,567,330 B2 | 5/2003 | Fujita et al. | |
| 6,822,907 B2 * | 11/2004 | Maruyama et al. | 365/185.21 |
| 6,882,008 B1 | 4/2005 | Ohsawa | |
| 6,934,186 B2 | 8/2005 | Fazan et al. | |
| 6,937,516 B2 | 8/2005 | Fazan et al. | |
| 7,184,348 B2 * | 2/2007 | Crippa et al. | 365/207 |
| 7,400,547 B2 * | 7/2008 | Oikawa | 365/229 |

2003/0231524 A1    12/2003  Ohsawa (Continued)

FOREIGN PATENT DOCUMENTS

JP    2004-103159    4/2004

(Continued)

OTHER PUBLICATIONS

Takashi Ohsawa et al., "Memory Design Using a One-Transistor Gain Cell on SOI", IEEE Journal of Solid-State Circuits, vol. 37, No. 11, Nov. 2002.

(Continued)

*Primary Examiner*—Pho M. Luu
(74) *Attorney, Agent, or Firm*—Harness, Dickey & Pierce

(57) ABSTRACT

One embodiment includes a plurality of word lines, a plurality of bit lines intersecting with the plurality of word lines, a plurality of memory cells formed at intersections of and connected to the plurality of word lines and the plurality of bit lines. Each of the plurality of memory cells may be a floating body cell. A bit line selecting circuit may be configured to selectively connect each of the plurality of bit lines to an output bit line. The embodiment may further include plurality of sense amplifiers, where the plurality of sense amplifiers is greater than one and less than the plurality of bit lines in number. A sense amplifier switching structure may be configured to selectively connect each of the plurality of sense amplifiers to the output bit line.

31 Claims, 13 Drawing Sheets

U.S. PATENT DOCUMENTS

| | | |
|---|---|---|
| 2005/0013163 A1 | 1/2005 | Ferrant et al. |
| 2005/0068807 A1 | 3/2005 | Ohsawa |
| 2005/0259489 A1 | 11/2005 | Ohsawa |
| 2006/0114717 A1 | 6/2006 | Fazan et al. |
| 2006/0157785 A1* | 7/2006 | Morikado ............. 257/347 |
| 2007/0133330 A1 | 6/2007 | Ohsawa |
| 2007/0159903 A1 | 7/2007 | Kim et al. |
| 2008/0123439 A1 | 5/2008 | Park et al. |

FOREIGN PATENT DOCUMENTS

| | | |
|---|---|---|
| JP | 2004-335883 | 11/2004 |
| JP | 2005-108341 | 4/2005 |
| JP | 2005-251256 | 9/2005 |
| JP | 2006-040421 | 2/2006 |
| JP | 2006-065901 | 3/2006 |
| JP | 2006-073055 | 3/2006 |
| JP | 2006-127631 | 5/2006 |
| KR | 100122507 | 9/1997 |
| KR | 1020030015823 | 2/2003 |

OTHER PUBLICATIONS

S. Okhonin et al., "A Capacitor-Less 1T-Dram Cell", IEEE Electron Device Letters, vol. 23, No. 2, Feb. 2002.

* cited by examiner

SEMICONDUCTOR INTEGRATED CIRCUIT AND METHOD OF OPERATING THE SAME

FOREIGN PRIORITY INFORMATION

A claim of priority under 35 U.S.C. 119 is made to Korean Application No. 10-2006-132902, filed Dec. 22, 2006, the entire contents of which are hereby incorporated by reference.

BACKGROUND

FIG. 1 illustrates a prior art integrated semiconductor memory circuit. As shown, the memory circuit includes a memory array and sensing structure 100, which will be described in greater detail below with respect to FIGS. 2-4. A command decoder 102 receives a command CMD (e.g., read, write, etc.), and decodes the command into control signals for controlling a row decoder 104 and a column decoder 106. The row decoder 104 and column decoder 106 receive the control signals and address information, and generate drive signals based on the controls signals and address information. For example, the row decoder 104 generates word line drive signals to drive word lines WL of the memory array and sensing structure 100. The column decoder 106 generates bit lines select signals BLS for driving bit line selectors of the memory array and sensing structure 100. The data output from the memory array and sensing structure 100 are output on output (I/O), lines, and this output data is sensed by an I/O sense amplifier 108.

FIG. 2 shows the constitution of a cell array 1 and data sense circuits 3 connected thereto in the memory array and sensing structure 100. A DRAM cell MC is composed of one MISFET having a channel body in a floating state. This type of memory cell is also referred to more generally as a floating body cell. The structure of a DRAM cell MC using an n-channel MISFET is shown in FIG. 3. As shown in FIG. 3, the DRAM cell MC has a silicon substrate 10, a p-type silicon layer 12 isolated from the silicon substrate 10 by an insulating film 11 such as a silicon oxide film, a gate electrode 14 formed with a gate insulating film 13 therebetween, and n-type diffusion regions 15 and 16, which are a source and a drain, respectively. The p-type silicon layer 12 between the n-type diffusion regions 15 and 16 serves as a channel body.

The memory cell array 1 is structured as shown in FIG. 4. Specifically, each of the DRAM cells MC has a floating channel body isolated from one another, sources of the DRAM cells MC are fixed at a reference voltage (ground potential), gates of the DRAM cells aligned in one direction are connected to word lines WL, and drains of the DRAM cells aligned in a direction intersecting the word lines WL are connected to bit lines BL.

The DRAM cell MC dynamically stores a first data state in which the p-type silicon layer 12, which is the channel body, is set at a first potential and a second data state in which the p-type silicon layer 12 is set at a second potential. More specifically, the first data state is written in a manner in which high positive level voltages are applied to a selected word line WL and a selected bit line BL to make a selected DRAM cell perform a pentode operation and majority carriers (holes in the case of the n-channel) generated by impact ionization, which occurs near the drain junction, are held in the channel body. This is, for example, data "1". The second data state is written in a manner in which a high level voltage is applied to the selected word line WL to raise the channel body potential by capacitive coupling while a potential of the selected bit line BL is set at a low level, and a forward bias current is sent to the junction of the channel body and the drain of the selected DRAM cell so as to emit the majority carriers in the channel body into the drain. This is, for example, data "0". The DRAM cell MC may also be written in the first data state through gate induced drain leakage (GIDL). Here, a negative potential is applied to the word line while a positive potential is applied to the bit line. Again, the source remains fixed at the reference, ground voltage. This causes a high electric field in the gate/drain region to overlap, and tunneling of electrons from valence band to conduction band occurs. The tunneling electrons generate electron-hole pairs and electrons move to the drain while holes move to the body. Thus, the body potential of the transistor rises as with impact ionization; however, the current generated by GIDL is much less than with impact ionization.

As a result of biasing the substrate by the channel body potential, a threshold voltage Vth1 in the case of the data "1", is lower than a threshold voltage Vth0 in the case of the data "0". Accordingly, at the time of a data read operation, the data can be judged by detecting a cell current difference caused by a threshold voltage difference.

As will be appreciated, the DRAM cell of this nature eliminates the need for a capacitor to store data, and provides for further reduction in the size of integrated semiconductor memory circuits.

The data storage state is judged by comparing a cell current to a reference current. As a source for the reference current, a dummy cell DMC is prepared as shown in FIG. 2. The dummy cell DMC may be generally designed such that the reference current produced is at an intermediate value between a cell current Icell1 when the DRAM cell is the "1" data and a cell current Icell0 when the DRAM cell is the "0". However, in FIG. 2, the dummy cell DMC is composed of two MISFETs having the same structure as that of the DRAM cell MC and whose drains are connected in parallel to a dummy bit line DBL provided for every plural bit lines.

The "0" data is written in one MISFET-MC0 and the "1" data is written in the other MISFET-MC1. Gates of these MISFETs-MC0 and MC1 are connected to dummy word lines DWL1 and DWL2 respectively. The dummy word lines DWL1 and DWL2 are selectively driven simultaneously with a selected word line WL at the time of a data sense operation. Accordingly, a reference current Iref passed through the dummy bit line DBL is derived from Iref=Icell0+Icell1. Correspondingly, in data sense circuits 3, a cell current 2.times.Icell, which is double a detected cell current Icell, is generated to be compared with the aforesaid reference current Iref.

As shown in FIG. 2, the data sense circuits 3 are connected to the bit lines BL of the cell array 1 via bit line selecting circuits 2a. The bit line selecting circuits 2a are multiplexers each of which selects one line out of a plurality of the bit lines. In the example of FIG. 1, each of the bit line selecting circuits 2a selects one line out of four bit lines BL0 to BL3 in response to selecting signals BSL0 to BSL3 for the column decoder 106. The plurality of data sense circuits 3 share a reference voltage generating circuit 6 connected to the dummy bit line DBL which is provided for every plural bit lines. The reference voltage generating circuit 6 generates in a reference node RSN a reference voltage corresponding to the aforesaid reference current Iref, which is passed through the dummy bit line DBL and the dummy bit line selecting circuit 2b. Each of first current sense amplifiers 4a includes current mirror circuitry that generates the aforesaid double cell current 2.times.Icell, compares it with the reference current Iref, and generates in sense nodes SN a potential according to the data. Then, second sense amplifiers 4b, each of which detects the difference in the potential between the sense nodes SN and the reference node RSN, are provided.

In addition, between the sense amplifiers 4a and data lines DL (which are connected to the bit lines BL via the bit line selecting circuits 2a) and between the reference voltage generating circuit 6 and a reference data line RDL (which is connected to the dummy bit line DBL via a dummy bit line selecting circuit 2b by controlling a signal DBSL), clamping circuits 5 are provided for suppressing the rise in the voltages of the bit lines BL and the dummy bit line DBL respectively at the time of the data sense operation. The clamping circuits 5 prevent erroneous writing in the DRAM cell MC and the dummy cell DMC at the time of the data read operation, and more specifically, the clamping circuits 5 suppress the voltages of the bit lines BL and the dummy bit line DBL at a low level so that the selected memory cell and the dummy cell perform a triode operation at the time of the data sense operation.

Returning to FIG. 2, by employing a bit line selector 2a, a plurality of bit lines may share the same data sense circuit 3 as opposed to having a data sense circuit dedicated to each bit line. This saves on semiconductor real estate. However, a significant increase in access time occurs because only one of the bit lines is selected at a time by the bit line selector 2a. To help improve access time, a technique called page mode operation may be adopted. In page mode operation, a number of column accesses are performed in sequence for a single word line access. However, after selecting each bit line, a sensing operation and pre-charging operation still must be performed. Accordingly, a significant increase in access time still exists.

SUMMARY OF THE INVENTION

The present invention relates to semiconductor integrated circuits, and embodiments relate to a semiconductor integrated memory circuit.

One embodiment includes a plurality of word lines, a plurality of bit lines intersecting with the plurality of word lines, a plurality of memory cells formed at intersections of and connected to the plurality of word lines and the plurality of bit lines. Each of the plurality of memory cells may be a floating body cell. A bit line selecting circuit may be configured to selectively connect each of the plurality of bit lines to an output bit line. The embodiment may further include a plurality of sense amplifiers, where the plurality of sense amplifiers is greater than one and less than the plurality of bit lines in number. A sense amplifier switching structure may be configured to selectively connect each of the plurality of sense amplifiers to the output bit line.

In one embodiment, a controller may be configured to control operation of the sense amplifier switching structure. For example, the controller may be configured to control the sense amplifier switching structure such that the plurality of sense amplifiers are alternately connected to the output bit line during consecutive access of the plurality of memory cells. As another example, the controller may be configured to control the sense amplifier switching structure such that a same sense amplifier is not used for two consecutive access operations of the plurality of memory cells.

Another embodiment includes a plurality of word lines, a plurality of bit lines intersecting with the plurality of word lines, and a plurality of memory cells formed at intersections of and connected to the plurality of word lines and the plurality of bit lines. Each of the plurality of memory cells is a floating body cell. A bit line selecting circuit may be configured to selectively connect each of the plurality of bit lines to an output bit line. The embodiment may further include a plurality of sense amplifiers, where the plurality of sense amplifiers is greater than one and less than the plurality of bit lines in number. A sense amplifier switching structure may be configured to selectively connect each of the plurality of sense amplifiers to the output bit line. An enabling structure may be configured to disable all but one of the plurality of sense amplifiers based on an operating mode of the semiconductor integrated circuit.

A further embodiment includes a plurality of word lines, a plurality of bit lines intersecting with the plurality of word lines, and a plurality of memory cells formed at intersections of and connected to the plurality of word lines and the plurality of bit lines. Each of the plurality of memory cells is a floating body cell. A bit line selecting circuit may be configured to selectively output data on the plurality of bit lines. The embodiment may further include a plurality of sense amplifiers, where the plurality of sense amplifiers is greater than one and less than the plurality of bit lines in number. A selector may selectively supply the output data from the bit line selecting circuit to one of the plurality of sense amplifiers.

Yet another embodiment includes a plurality of memory cell blocks. Each memory cell block may be configured according to any of the embodiments.

The present invention also relates to a method of sense amplifying in a semiconductor integrated circuit memory. For example, the semiconductor integrated circuit memory may include a plurality of memory cells formed at intersections of and connected to a plurality of word lines and a plurality of bit lines. Each of the plurality of memory cells may be a floating body cell. The method includes selectively connecting one of the plurality of bit lines to an output bit line, and selectively connecting one of a plurality of sense amplifiers to the output bit line.

In another embodiment, the method includes selectively outputting data from the plurality of bit lines, and sense amplifying the output data such that a same sense amplifier is not used for two consecutive sense operations.

Yet another embodiment of the method includes selectively outputting data from the plurality of bit lines, and controlling which of a plurality of sense amplifiers senses the selected output data. Each of the sense amplifiers undergoes an equalization operation after a sense operation, and the controlling step controls which of a plurality of sense amplifiers senses the selected output data such that one of the sense amplifiers is selected while another of the sense amplifiers undergoes the equalization operation.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein.

DETAILED DESCRIPTION OF EXAMPLE EMBODIMENTS

Figure 1:
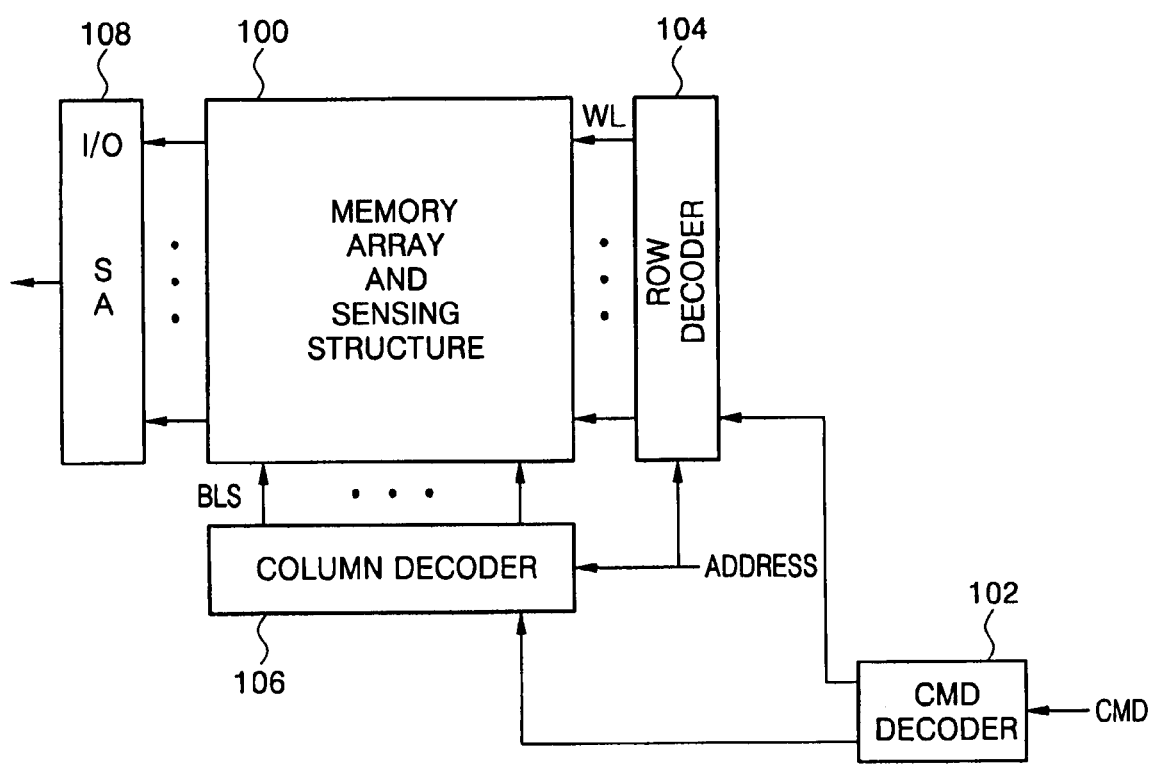
FIG. 1 illustrates a prior art integrated semiconductor memory circuit.
Figure 2:
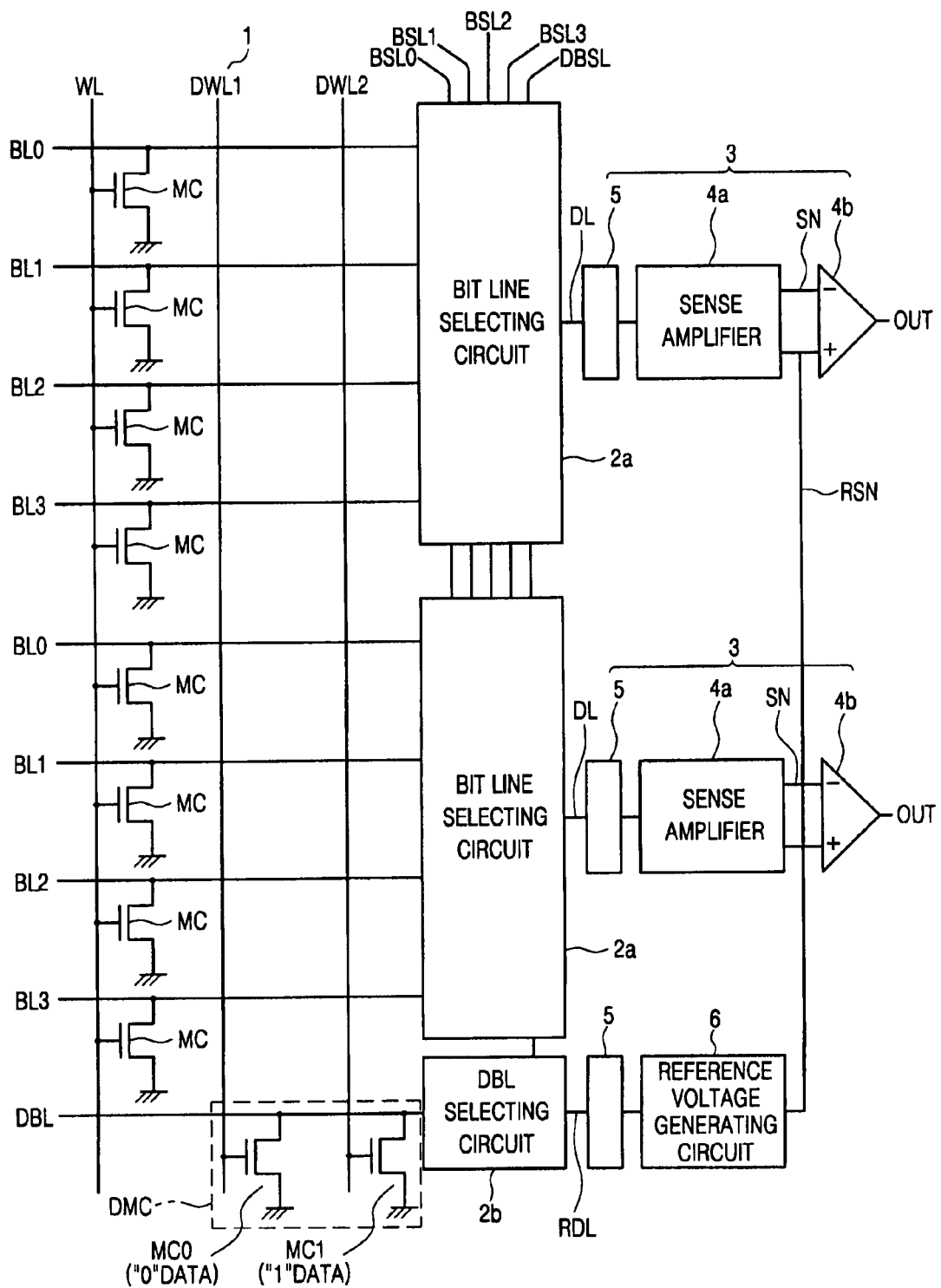
FIG. 2 shows the constitution of a cell array and data sense circuits connected thereto in the memory array and sensing structure of FIG. 1.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
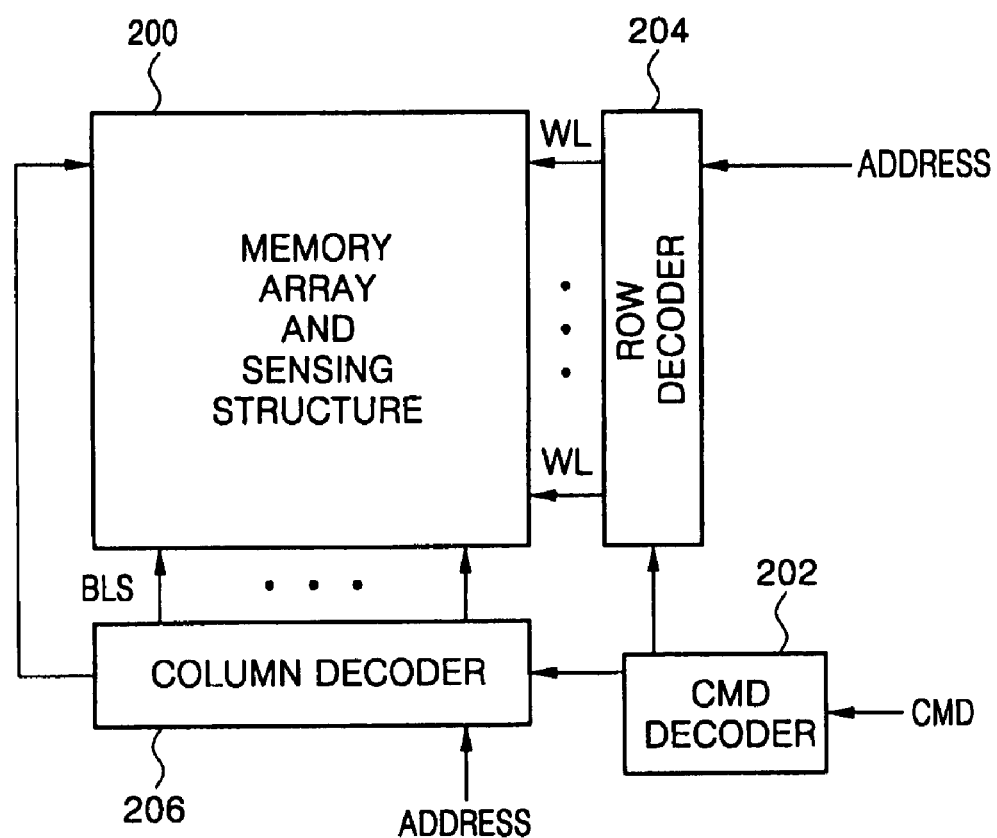
FIG. 5 illustrates an integrated semiconductor memory circuit according to an embodiment of the present invention.

FIG. 5 illustrates an integrated semiconductor memory circuit according to an embodiment of the present invention. As shown, the memory circuit includes a memory array and sensing structure 200, which will be described in greater detail below with respect to FIG. 6-7. A command decoder 202 receives a command CMD (e.g., read, write, etc.), and decodes the command into control signals for controlling a row decoder 204 and a column decoder 206. The row decoder 204 and column decoder 206 receive the control signals and address information, and generate drive signals based on the controls signals and address information. For example, the row decoder 204 generates word line drive signals to drive word lines WL of the memory array structure 200. The column decoder 206 generates bit lines select signals BLS for controlling bit line selectors, sense amplifiers and switching structures in the memory array and sensing structure 200, as will be described in detail below with respect to FIGS. 6-7.

Figure 3:
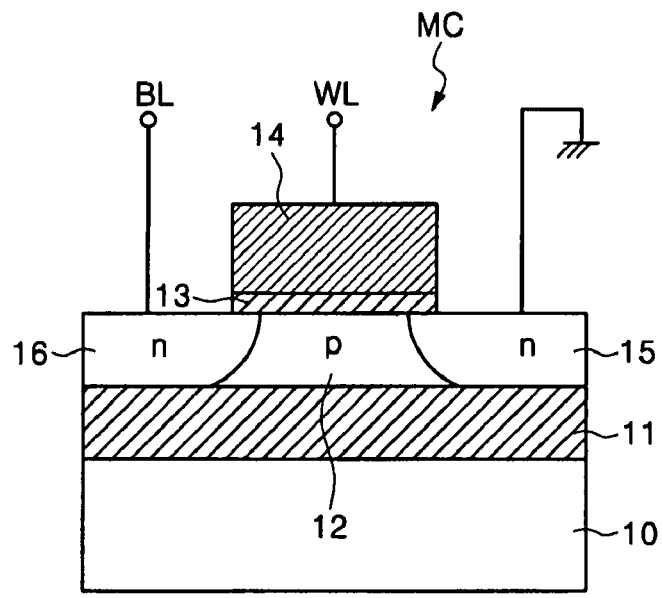
FIG. 3 illustrates the structure of a DRAM cell MC in FIG. 2 using an n-channel MISFET.
Figure 4:
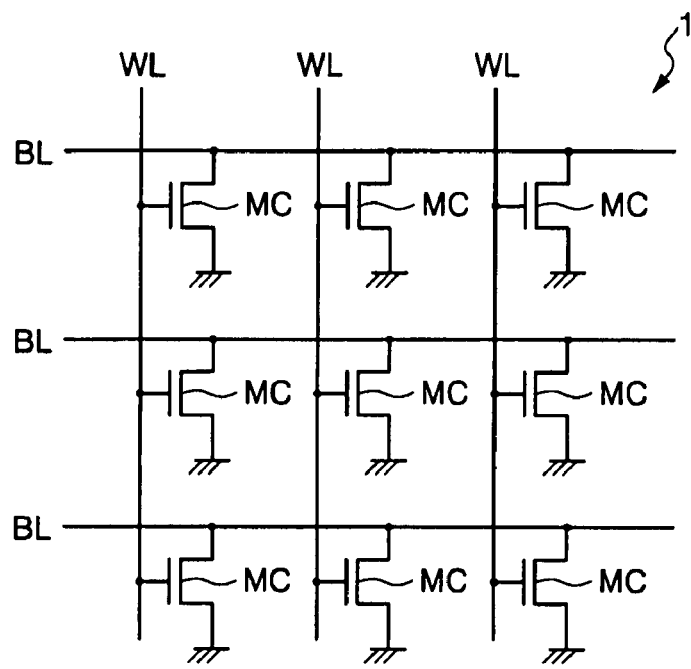
FIG. 4 illustrates the structure of the memory cell array shown in FIG. 2.
Figure 6:
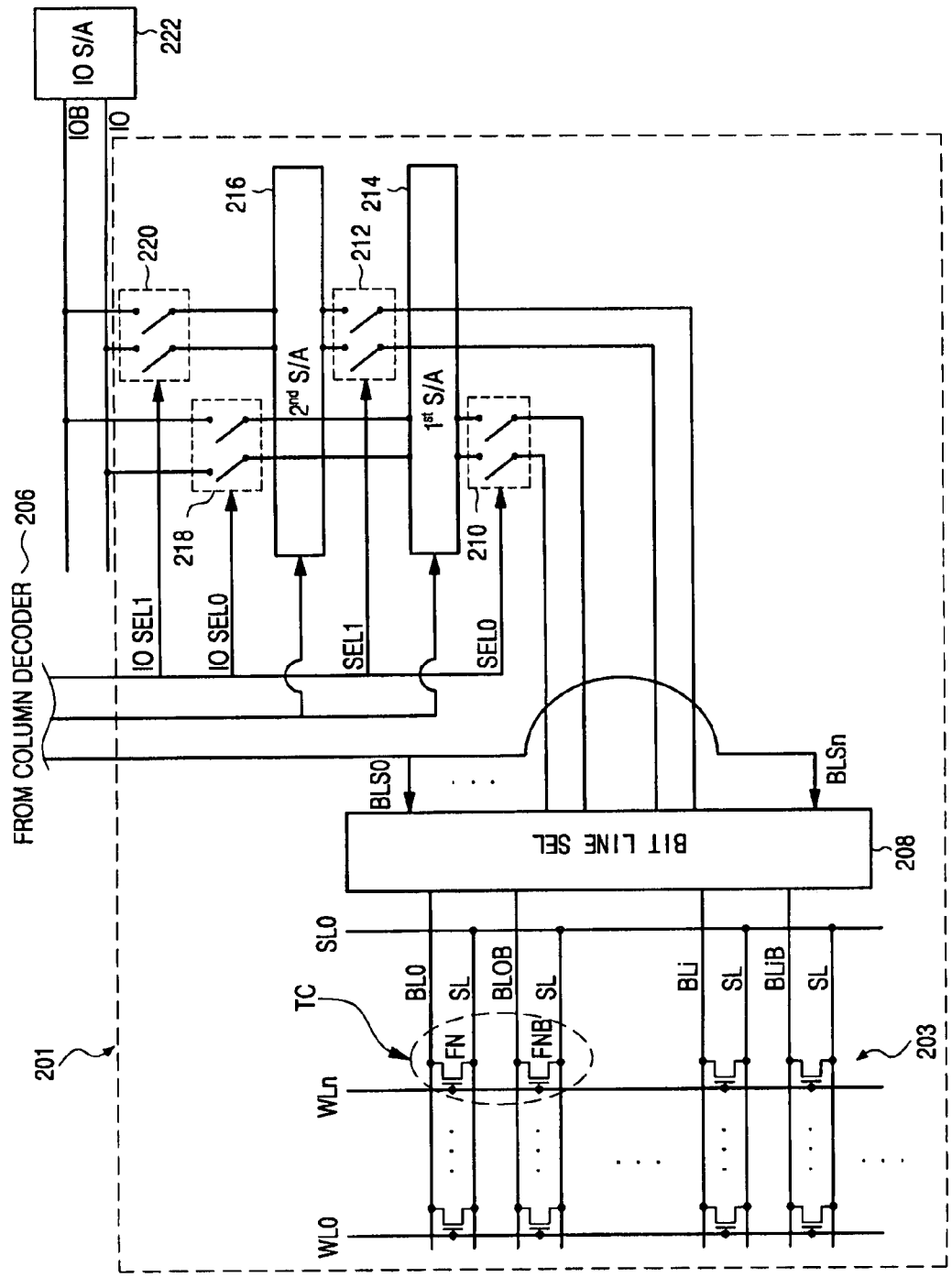
FIG. 6 illustrates an example embodiment of a block in the memory array and data sensing structure of FIG. 5.

The memory array and sensing structure 200 may be divided into a plurality of blocks. Each block may have the same structure, and FIG. 6 illustrates an example embodiment of one block 201 of the plurality of blocks. As shown, the block 201 includes a memory array portion 203. In this embodiment, the memory array portion 203 includes a plurality of word lines WL intersecting with a plurality of bit lines BL, complementary bit lines BLB and source lines SL. The plurality of bit lines BL, complementary bit lines BLB and source lines SL are in parallel. Memory cells are formed at intersections of the word lines WL and the bit lines BL, and at intersections of the word lines WL and complementary bit lines BL. The memory array employs capacitor-less memory cells FN, FNB that may have the same structure as described previously with respect to FIG. 3; namely, floating body cells or MISFETs may be employed. In particular, the memory array employs a twin cell (TC) structure for storing data. Each twin cell TC includes a true cell FN and a complementary cell FNB. The true cell FN is a floating body cell with a gate connected to a word line WL, a source connected to a source line SL and a drain connected to a bit line BL. The complementary cell FNB is a floating body cell with a gate connected to the same word line WL as the true cell FN, a source connected to a source line SL and a drain connected to a complementary bit line BLB. The memory array portion 203 includes twin cells TC arranged in columns and rows, the number of each of which being a matter of design choice. Each row of twin cells TC is associated with a word line WL0, WL1, etc. Each column of twin cells TC is associated with a bit line BL, a complementary bit line BLB and source lines SL. The bit lines BL0, BL1, etc. and complementary bit lines BL0B, BL1B, etc. lead to a bit line selector 208. The source lines SL lead to a source power line SLP, which supplies the source voltage.

The bit line selector 208 selects a bit lines pair based on bit line selection signals BLSs from the column decoder 206. The voltages on the selected bit lines are supplied to first and second sense amplifier selectors 210 and 212. The first sense amplifier selector 210 selectively supplies the voltages to a first sense amplifier 214 based on a control signal SEL0 from the column decoder 206, and the second sense amplifier selector 212 selectively supplies the voltages to a second sense amplifier 216 based on a control signal SEL1 from the column decoder 206. The first and second sense amplifiers 214 and 216 operate, as described in detail below with respect to FIG. 7, based on control signals from the column decoder 206.

A third selector 218 selectively supplies output from the first sense amplifier 214 to output lines IO and IOB based on a control signal IO_SEL0 from the column decoder 206. A fourth selector 220 selectively supplies output from the second sense amplifier 216 to output lines IO and IOB based on a control signal IO_SEL1 from the column decoder 206. The output data on the output lines IO and IOB is sensed by an I/O sense amplifier 222.

Figure 7:
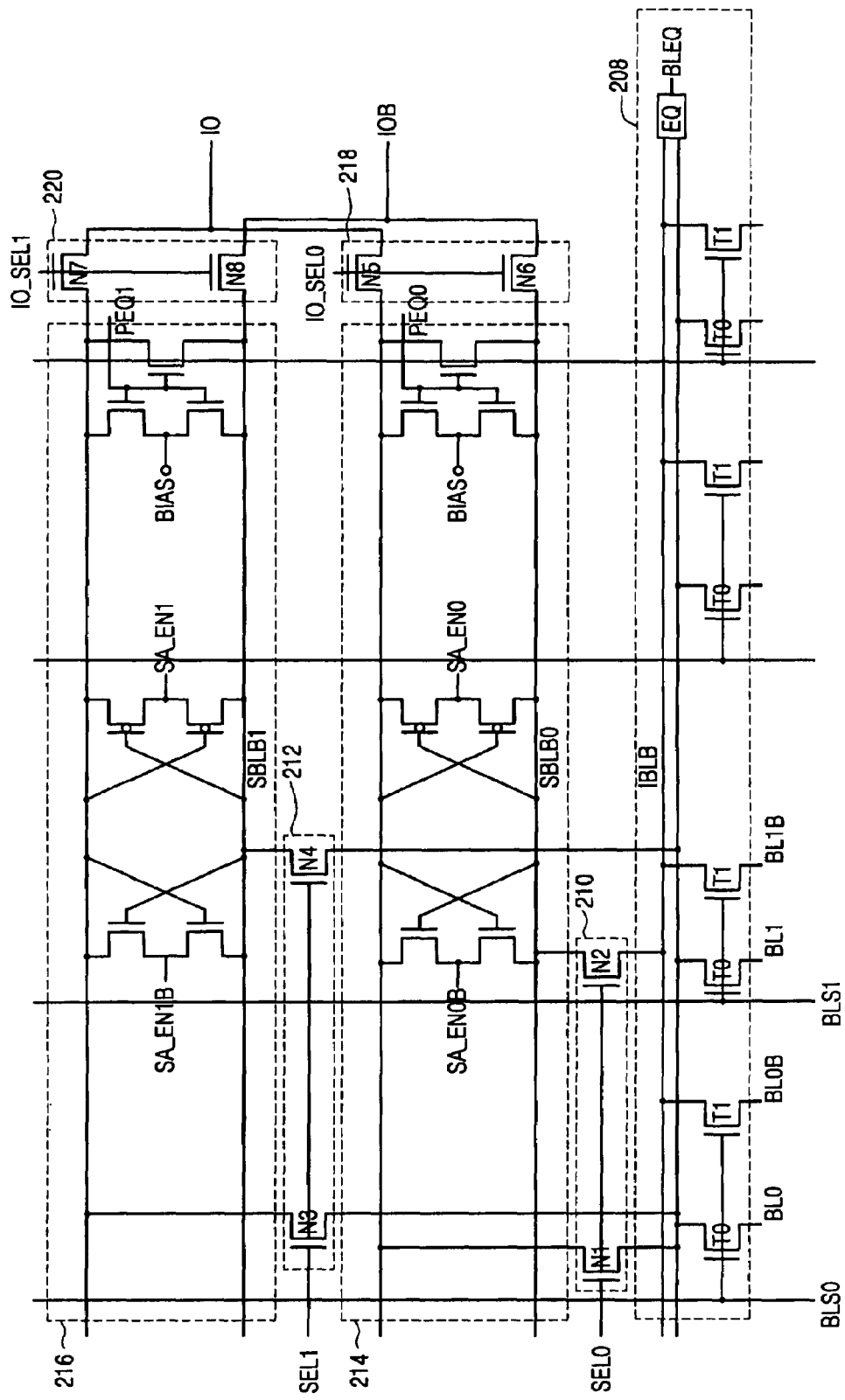
FIG. 7 illustrates the data sense circuits of FIG. 6 in greater detail according to one embodiment.

FIG. 7 illustrates the data sense circuits of FIG. 6 in greater detail according to one embodiment. Namely, FIG. 7 illustrates the bit line selector 208, first selector 210, second selector 212, first sense amplifier 214, second sense amplifier 216, third selector 218 and fourth selector 220 in greater detail. As shown, the bit line selector 208 includes an NMOS transistor T0 associated with each bit line BL and an NMOS transistor T1 associated with each complementary bit line BLB. Each transistor T0 connects the associated bit line BL to an intermediate bit line IBL, and each transistor T1 connects the associated complementary bit line BLB to a complementary intermediate bit line IBLB. For each pair of bit line BL and complementary bit line BLB, the associated transistors T0 and T1 receive a same bit line select signal BLS at their gates. Namely, transistors T0 and T1 for bit line and complementary bit lines BLi and BLBi both receive the bit line select signal BLSi from the column decoder 206 at their gates. By controlling the bit line select signals BLSs, the column decoder 206 controls which pair of bit line and complementary bit line BL and BLB are connected to the intermediate bit line IBL and complementary intermediate bit line IBLB.

An equalization circuit, EQ is connected to the intermediate bit line IBL and complementary intermediate bit line IBLB, and selectively equalizes the voltages on the intermediate bit line IBL and complementary intermediate bit line IBLB in response to an equalization signal BLEQ. Namely, the equalization circuit EQ selectively causes the intermediate bit line IBL and complementary intermediate bit line IBLB to carry the same voltage. For example, the equalization circuit EQ may be an NMOS transistor connected between the intermediate bit line IBL and complementary intermediate bit line IBLB, and receiving the equalization signal BLEQ at its gate.

As shown in FIG. 7, the first selector 210 includes first and second NMOS transistors N1 and N2. The first NMOS transistor N1 is connected between the intermediate bit line IBL and a sensing bit line SBL0 of the first sensing amplifier 214. The second NMOS transistor N2 is connected between the complementary intermediate bit line IBLB and a complementary sensing bit line SBLB0 of the first sensing amplifier 214. Both the first and second NMOS transistors N1 and N2 receive the selection signal SEL0 at their gates. Accordingly, the first and second NMOS transistors N1 and N2 selectively connect the intermediate bit line IBL and complementary intermediate bit line IBLB with the sensing bit line SBL0 and complementary sensing bit line SBLB0, respectively, in response to the selection signal SEL0.

The second selector 212 includes third and fourth NMOS transistors N3 and N4. The third NMOS transistor N3 is connected between the intermediate bit line IBL and a sensing bit line SBL1 of the second sensing amplifier 216. The fourth NMOS transistor N4 is connected between the complementary intermediate bit line IBLB and a complementary sensing bit line SBLB1 of the second sensing amplifier 216. Both the third and fourth NMOS transistors N3 and N4 receive the selection signal SEL1 at their gates. Accordingly, the third and fourth NMOS transistors N3 and N4 selectively connect the intermediate bit line IBL and complementary intermediate bit line IBLB with the sensing bit line SBL1 and complementary sensing bit line SBLB1 in response to the selection signal SEL1.

The first and second sense amplifiers 214 and 216 may be well known voltage sense amplifiers as shown in FIG. 7. Accordingly, the structure and operation of the voltage sense amplifiers will not be described in great detail. As is well-known, the first voltage sense amplifier 214 receives enable signal SA_EN0 and complementary enable signal SA_EN0B, which is opposite of the enable signal SA_EN0, from the column decoder 206. If enabled by the enable signal SA_EN0 and complementary enable signal SA_EN0B, the first voltage sense amplifier 214 senses and amplifies a voltage difference between the voltages on the sensing bit line SBL0 and complementary sensing bit line SBLB0. If the first voltage sense amplifier 214 is not enabled, an equalization circuit 224 of the first voltage sense amplifier 214 may be enabled by an equalization signal PEQ0 from the column decoder 206. Enabling this circuit equalizes the voltages on the sensing bit line SBL0 and the complementary sensing bit line SBLB0 to a voltage BIAS applied to the equalization circuit 224.

The third selector 218 includes fifth and sixth NMOS transistors N5 and N6. The fifth NMOS transistor N5 is connected between the sensing bit line SBL0 of the first voltage sense amplifier 214 and the output line IO, and the sixth NMOS transistor N6 is connected between the complementary sensing bit line SBLB0 of the first voltage sense amplifier 214 and the complementary output line IOB. The fifth and sixth NMOS transistors N5 and N6 receive the same selection signal IO_SEL0 from the column decoder 206 at their gates. Accordingly, the fifth and sixth NMOS transistors N5 and N6 selectively connect the sensing bit line SBL0 and the complementary sensing bit line SBLB0 to the output line IO and the complementary output line IOB, respectively, in response to the selection signal IO_SEL0.

Similar to the first voltage sense amplifier 214, the second voltage sense amplifier 216 receives enable signal SA_EN1 and complementary enable signal SA_EN1B, which is opposite of the enable signal SA_EN1, from the column decoder 206. If enabled by the enable signal SA_EN1 and complementary enable signal SA_EN1B, the second voltage sense amplifier 216 senses and amplifies a voltage difference between the voltages on the sensing bit line SBL1 and complementary sensing bit line SBLB1. If the second voltage sense amplifier 216 is not enabled, an equalization circuit 226 of the second voltage sense amplifier 214 may be enabled by an equalization signal PEQ1 from the column decoder 206. Enabling this circuit equalizes the voltages on the sensing bit line SBL1 and the complementary sensing bit line SBLB1 to the voltage BIAS applied to the equalization circuit 226.

The fourth selector 220 includes seventh and eighth NMOS transistors N7 and N8. The seventh NMOS transistor N7 is connected between the sensing bit line SBL1 of the first voltage sense amplifier 216 and the output line IO, and the eighth NMOS transistor N8 is connected between the complementary sensing bit line SBLB1 of the second voltage sense amplifier 216 and the complementary output line IOB. The seventh and eighth NMOS transistors N7 and N8 receive the same selection signal IO_SEL1 from the column decoder 206 at their gates. Accordingly, the seventh and eighth NMOS transistors N7 and N8 selectively connect the sensing bit line SBL1 and the complementary sensing bit line SBLB1 to the output line IO and the complementary output line IOB, respectively, in response to the selection signal IO_SEL1.

During operation, the column decoder 206 operates as a controller and controls the operation of the first, second, third and fourth selectors 210, 212, 218 and 220, as well as the first and second sense amplifiers 214 and 216 such that i) only one of the sense amplifiers is connected to perform and does perform the sense amplification operation on the selected bit and complementary bit lines while ii) the other sense amplifier undergoes the equalization operation. In this manner, the pre-charge operation (referred to here as an equalization operation) for one sense amplifier occurs while the other sense amplifier performs the sense operation. This effectively hides the pre-charge or equalization operation time, and reduces access time.

Figure 8:
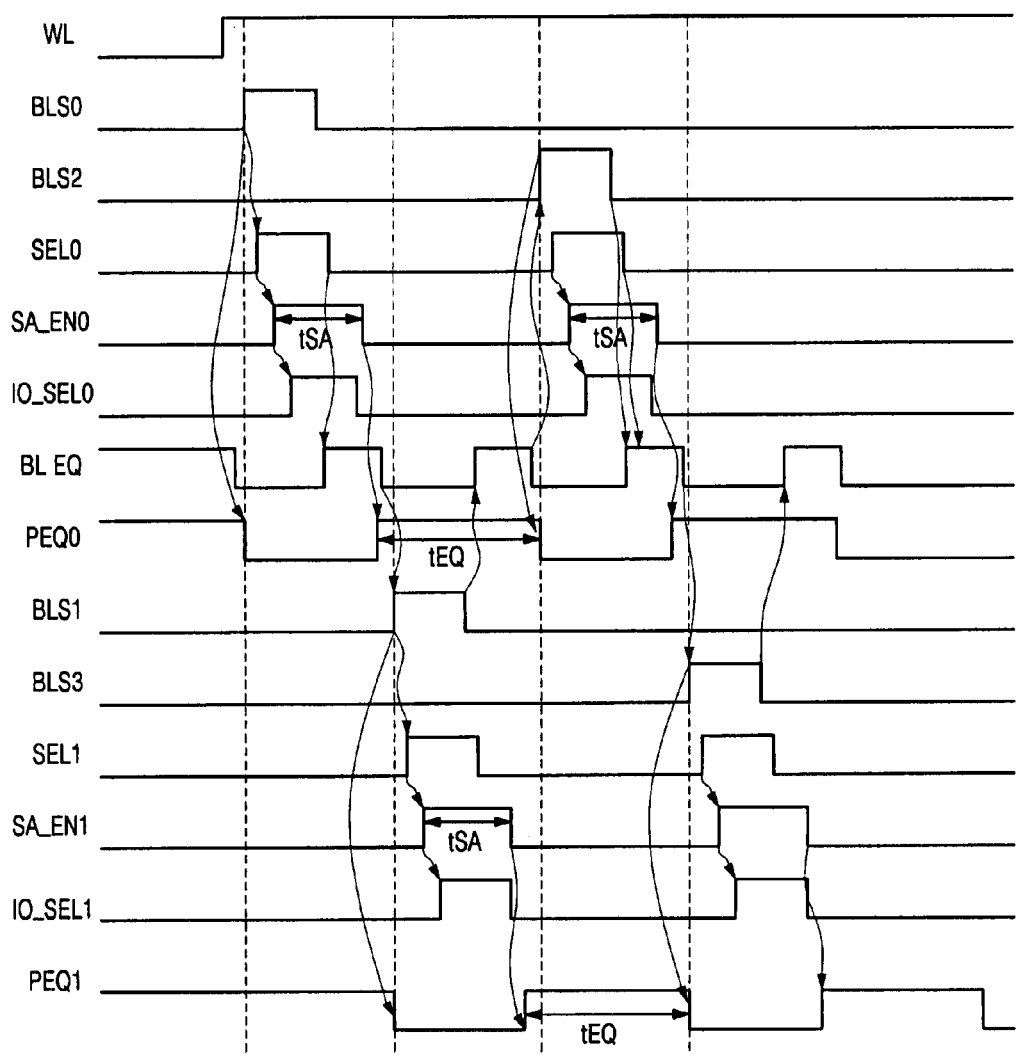
FIG. 8 illustrates the control signals output by the row decoder and column decoder of FIG. 5 during, for example, a page mode operation of the memory array and data sensing structure illustrated in FIGS. 6-7.

FIG. 8 illustrates the control signals output by the row decoder 204 and column decoder 206 during, for example, a page mode operation. As shown, a word line WL is activated, and each bit line BL0, BL1, etc. is sequentially selected by corresponding bit lines selection signal BLS0, BLS1, BLS2, etc. In this example, after selection of bit line BL0, and complementary bit line BL0B, by activation of bit line selection signal BLS0, the selection signal SEL0 is activated to connect the bit line BL0 and complementary bit line BLB0 with the sensing bit line SBL0 and complementary sensing bit line SBLB0, respectively, of the first sensing amplifier 214 via the intermediate bit line IBL and complementary intermediate bit line IBLB.

The column decoder 206 also enables the first sensing amplifier 214 by activating the sensing enable signal SA_EN0 for an enabling period tSA, and the column decoder 206 connects the output of the first sensing amplifier 214 to the output lines IO and IOB by activating the selection signal IO_SEL0.

During this period of time, no other bit lines are selected, the second sense amplifier 216 is deactivated, and the second sense amplifier 216 is not connected to either the intermediate bit or complementary bit lines IBL and IBL0 or to the output lines IO and IOB.

After the selection signal SEL0 is deactivated, and the first sensing amplifier 214 is disconnected from the intermediate and complementary intermediate bit lines IBL and IBLB, intermediate and complementary intermediate bit lines IBL and IBLB are equalized by the column decoder 206 activating the equalization signal BL EQ. And, after the first sensing amplifier 214 is disabled and no longer connected to the output lines IO and IOB, the sensing bit line SBL0 and complementary sensing bit line SBLB0 undergo an equalization operation. Namely, the column decoder 206 activates the equalization signal PEQ0 for a time period tEQ to complete equalization (or pre-charging) of the sensing bit line SBL0 and complementary sensing bit line SBL0.

As shown in FIG. 8, while the first sensing amplifier 214 undergoes the equalization operation, the second sensing amplifier 216 is used in the sensing operation of the next bit line, bit line BL1. As shown, selection of bit line BL1, and complementary bit line BL1B, is accomplished by activation of bit line selection signal BLS1. The column decoder 206 then activates the selection signal SEL1 to connect the bit line BL1 and complementary bit line BLB1 with the sensing bit line SBL1 and complementary sensing bit line SBLB1, respectively, of the second sensing amplifier 216 via the intermediate bit line IBL and complementary intermediate bit line IBLB.

The column decoder 206 also enables the second sensing amplifier 216 by activating the sensing enable signal SA_EN1 for the enabling period tSA, and the column decoder 206 connects the output of the second sensing amplifier 216 to the output lines IO and IOB by activating the selection signal IO_SEL1.

After the selection signal SEL1 is deactivated, and the second sensing amplifier 216 is disconnected from the intermediate and complementary intermediate bit lines IBL and IBLB, the intermediate and complementary intermediate bit lines IBL and IBLB are equalized by the column decoder 206 activating the equalization signal BL EQ. And, after the second sensing amplifier 216 is disabled and no longer connected to the output lines IO and IOB, the sensing bit line SBL1 and complementary sensing bit line SBLB1 undergo an equalization operation. Namely, the column decoder 206 activates the equalization signal PEQ1 for a time period tEQ to complete equalization (or pre-charging) of the sensing bit line SBL1 and complementary sensing bit line SBL1.

At about this time, the equalization operation for the first sensing amplifier 214 has completed, and as shown in FIG. 8, the first sensing amplifier 214 may be used for the sensing operation of the next bit line. The above operations repeat for bit lines BL3, etc. Accordingly, the column decoder 206 controls the first and second selectors 210 and 212 such that the two sense amplifiers 214 and 216 are alternately connected to the intermediate bit line IBL and complementary intermediate bit line IBLB during consecutive access of memory cells via the bit lines. In particularly, the column decoder 206 hides the equalization operation by controlling the selectors and the sense amplifiers such that a same sense amplifier is not used for two consecutive access operations of the memory cells.

Figure 9:
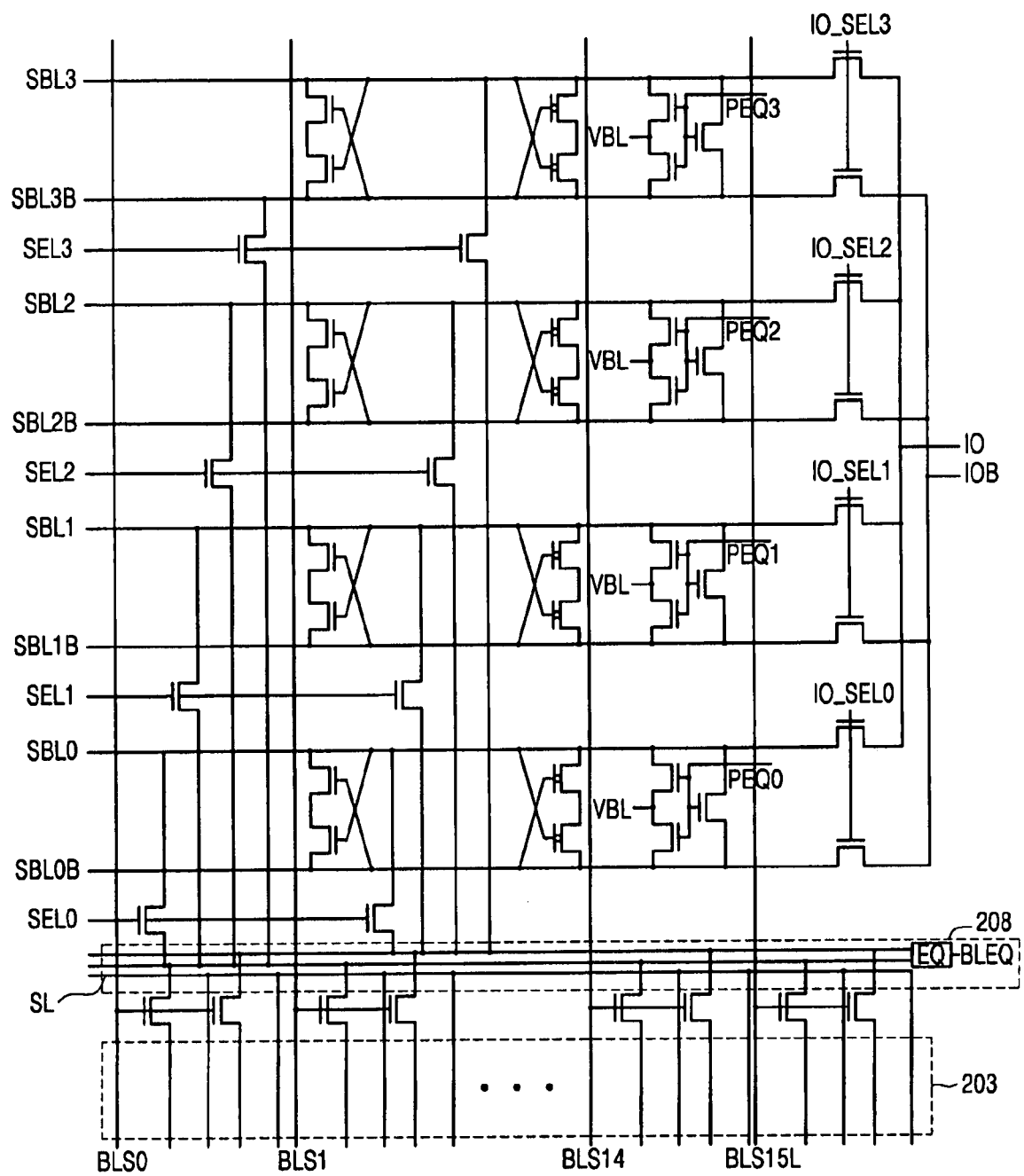
FIG. 9 illustrates another example embodiment of a block in the memory array and data sensing structure of FIG. 5.
Figure 10:
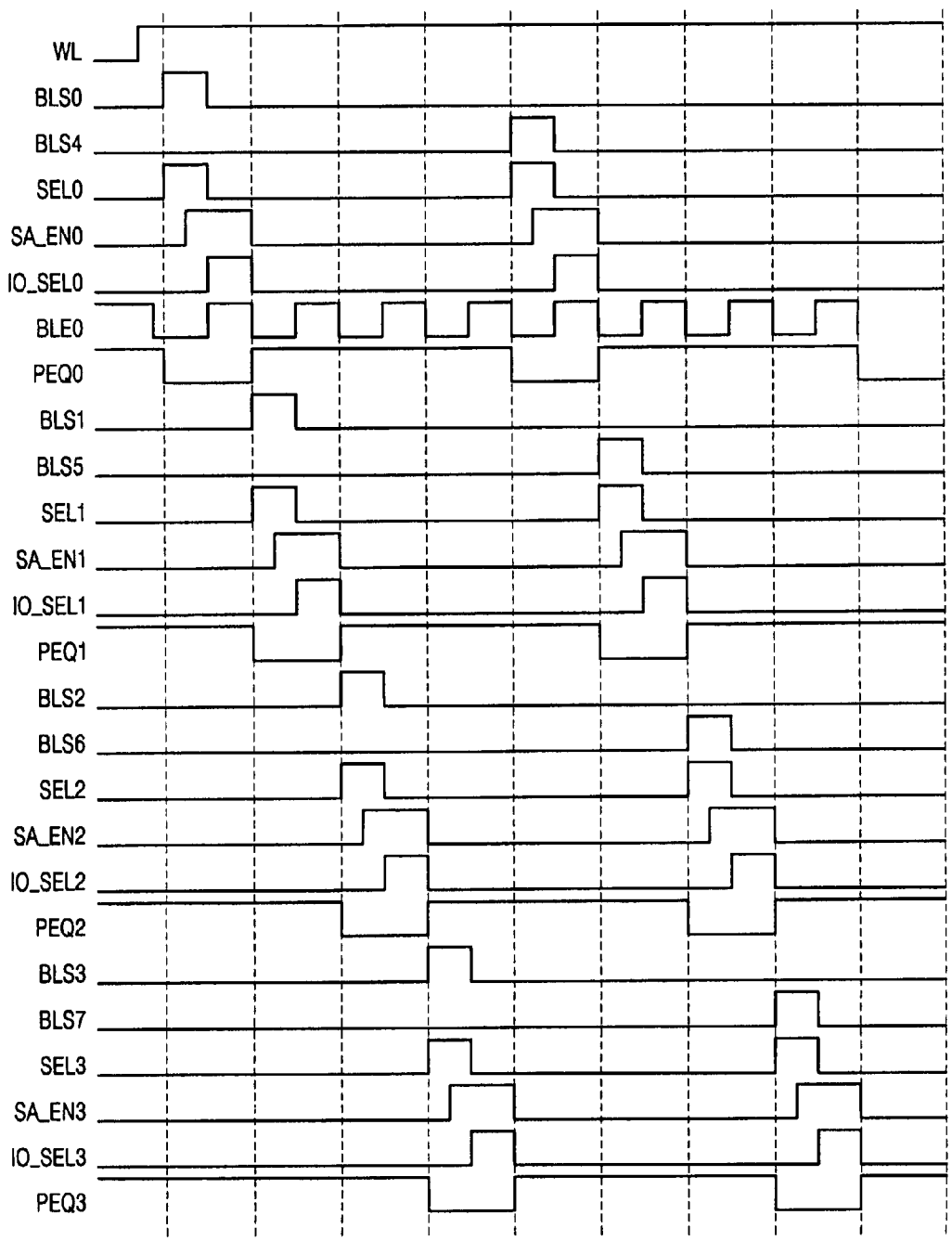
FIG. 10 illustrates the control signals output by the row decoder and column decoder of FIG. 5 during, for example, a page mode operation of the memory array and data sensing structure illustrated in FIG. 9.

By using two sense amplifiers, the access time during, for example, a page mode operation may be reduced. However, because the number of sense amplifiers is less than the number of bit lines, a savings of semiconductor real estate may be achieved. Furthermore, it will be appreciated that the number of sense amplifiers used in block 201 is not limited to two sense amplifiers. Instead the number of sense amplifiers may be two or more, but less than the number of bit lines. For each additional sense amplifier, the data sense circuit will also include i) an additional selector for selectively connecting the sense amplifier to the intermediate and complementary intermediate bit lines IBL and IBLB, and ii) an additional selector for selectively connecting the sense amplifier to the output lines IO and IOB. FIG. 9 below illustrates another example of the data sense circuits of a block that uses four sense amplifiers, and FIG. 10 illustrates the controls signals applied to control which sense amplifier is enabled for a sense operation and which sense amplifier undergoes the equalization operation. Because an understanding of FIGS. 9 and 10 will be readily apparent from the description of FIGS. 5-8 above, FIGS. 9 and 10 will not be described in detail for the sake of brevity.

Figure 11:
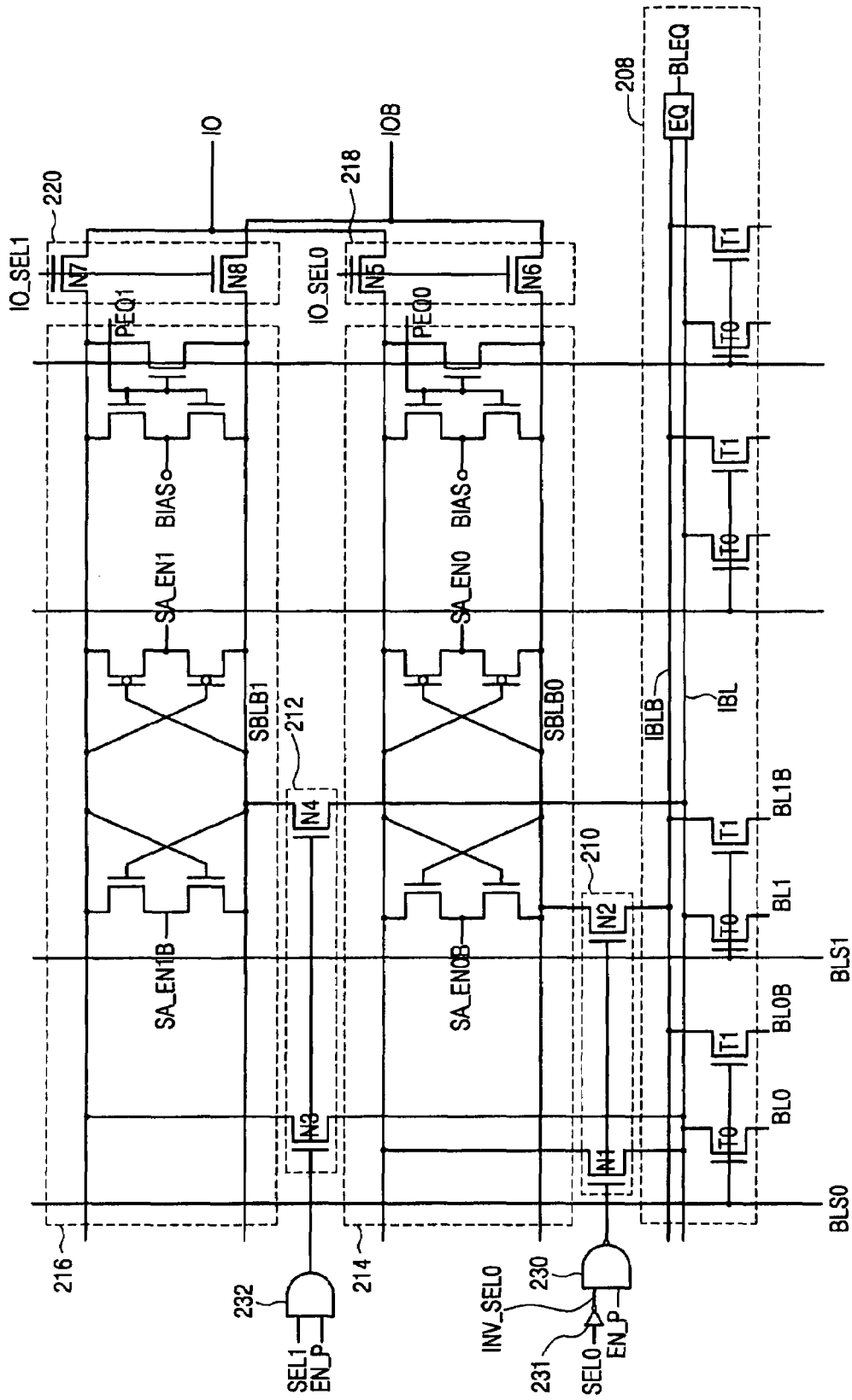
FIG. 11 illustrates the data sense circuits of FIG. 6 in greater detail according to another embodiment.

FIG. 11 illustrates the data sense circuits of FIG. 6 in greater detail according to another embodiment. This embodiment is the same as the embodiment of FIG. 7 except for the addition of a NAND gate 230, an inverter 231 and AND gate 232. Accordingly, only these differences will be described in detail for the sake of brevity. As shown, the inverter 231 inverts the selection signal SEL0. The NAND gate 230 receives the inverted selection signal INV_SEL0 and an enable signal EN_P as inputs. The output of the NAND gate 230 is supplied to the gates of the first and second NMOS transistors N1 and N2. Therefore, the output of the NAND gate 230 controls the operation of the selector 210.

As further shown, the AND gate 232 receives the selection signal SEL1 and the enable signal EN_P as inputs. The output of the AND gate 232 is supplied to the gates of the third and fourth NMOS transistors N3 and N4. Therefore, the output of the AND gate 232 controls the operation of the selector 212.

The enable signal EN_P indicates whether hiding the equalization operation as described above with respect to FIG. 7 is enabled. If enabled, the enable signal EN_P is a logic high voltage, and the NAND gate 230 and the AND gate 232 output the selection signal SEL0 and the selection signal SEL1, respectively. Accordingly, the embodiment of FIG. 11 operates in the same manner as described above with respect to FIG. 7.

However, if the enable signal EN_P is logic low, hiding the equalization operation as described above with respect to FIG. 7 is disabled. As a result, the selector 212 can not connect the intermediate bit line IBL and the complementary intermediate bit line IBLB to the second sense amplifier 216 regardless of the selection signal SEL1. As a further result, the selector 210 connects the intermediate bit line IBL and the complementary intermediate bit line IBLB to the first sense amplifier 214 regardless of the selection signal SEL0.

This embodiment permits control over whether hiding the equalization operation is permitted or not. Whether to enable or disable may be determined by user input, an externally supplied signal or a programmable signal such as mode register set or fusing method, etc. For example, the enable signal may be a page mode enable signal indicating whether the page mode operation is enabled. It will be appreciated that the embodiment of FIG. 11 may be applied to the other embodiments disclosed herein and modifications/variations thereof.

Figure 12:
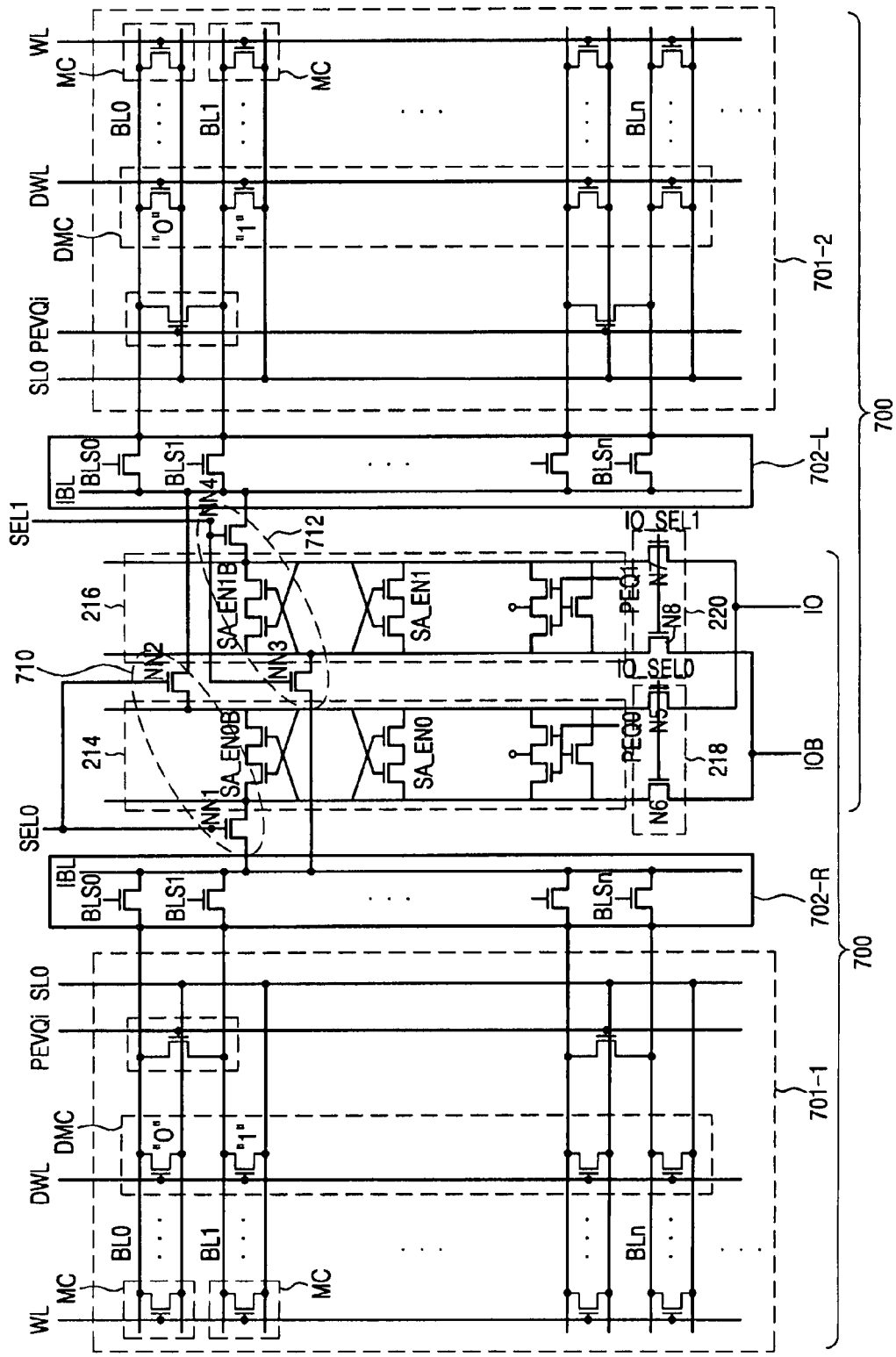
FIG. 12 illustrates a further example embodiment of a block in the memory array and data sensing structure of FIG. 5.

FIG. 12 illustrates another embodiment of a block of the memory array and sensing structure 200 shown in FIG. 5. As shown, in this embodiment, the memory array portion 701 of a block has an open bit line structure and two adjacent blocks 700 share connection to the first and second sense amplifiers 214 and 216. A bit line selector 702 is disposed on either side of each memory array portion 701, and the first and second sense amplifiers 214 and 216 are disposed between adjacent bit line selectors 702.

The memory array portions 701 include a plurality of word lines WL intersecting with a plurality of bit lines BL and source lines SL. The plurality of bit lines BL and source lines SL are in parallel. Memory cells MC are formed at intersections of the word lines WL and the bit lines BL. The memory array portions 701 employ capacitor-less memory cells MC that may have the same structure as described previously with respect to FIG. 3; namely, floating body cells may be employed. In particular, the memory array portions 701 employs an open bit line structure for storing data. Namely, unlike the embodiment of FIG. 6-7, there are no complementary cells FNB, complementary bit lines and complementary source lines. Each memory cell MC is a floating body cell or MISFET with a gate connected to a word line WL, a source connected to a source line SL and a drain connected to a bit line BL.

The memory array portion 701 includes memory cells MC arranged in columns and rows, the number of each of which being a matter of design choice. Each row of memory cells is associated with a word line WL0, WL1, etc. Each column of memory cells MC is associated with a bit line BL and a source line SL.

Furthermore, each memory array portion 701 includes a row of dummy cells DMC connected to a dummy word line DWL. The dummy word lines DWL are controlled by the row decoder 204. The dummy memory cells DMC connected to even numbered bit lines BL0, BL2, etc. store a "1", and the dummy memory cells DMC connected to odd numbered bit line BL1, BL3, etc. store a "0". It will be appreciated that the opposite arrangement may be employed. Still further, an equalization transistor EQT connects each odd numbered bit line (e.g., BL1) with its preceding even numbered bit line (e.g., BL0), and each equalization transistor EQT in a row of equalization transistors EQTs is connected to a same equalization control signal line PVEQ. The row decoder 204 controls the equalization control signal lines PVEQs.

The bit line selectors 702 include a transistor T0 associated with each bit line BL. As with the previous embodiments, the transistor T0 selectively connects the associated bit line BL with an intermediate bit line IBL based on respective bit line selection signal BLS from the column decoder 206.

In this embodiment, a first selector 710 includes first and second NMOS transistors NN1 and NN2. The first NMOS transistor NN1 is connected between i) the intermediate bit line IBL of the bit line selector 702-R to the right of a first memory array portion 701-1 and ii) a sensing bit line SBL0 of the first sensing amplifier 214. The second NMOS transistor NN2 is connected between i) the intermediate bit line IBL of the bit line selector 702-L to the left of a second memory array portion 701-2 and ii) a complementary sensing bit line SBLB0 of the first sensing amplifier 214. Both the first and second NMOS transistors NN1 and NN2 receive the selection signal SEL0 at their gates. Accordingly, the first and second NMOS transistors NN1 and NN2 selectively connect the intermediate bit lines IBL of the bit line selectors 702-R and 702-L to the sensing bit line SBL0 and complementary sensing bit line SBLB0, respectively, in response to the selection signal SEL0.

A second selector 712 includes third and fourth NMOS transistors NN3 and NN4. The third NMOS transistor NN3 is connected between i) the intermediate bit line IBL of the bit line selector 702-R to the right of the first memory array portion 701-1 and ii) a sensing bit line SBL1 of the second sensing amplifier 216. The fourth NMOS transistor NN4 is connected between i) the intermediate bit line IBL of the bit line selector 702-L to the left of the second memory array portion 701-2 and ii) a complementary sensing bit line SBLB1 of the second sensing amplifier 216. Both the third and fourth NMOS transistors NN3 and NN4 receive the selection signal SEL1 at their gates. Accordingly, the third and fourth NMOS transistors NN3 and NN4 selectively connect the intermediate bit lines IBL of the bit line selectors 702-R and 702-L with the sensing bit line SBL1 and complementary sensing bit line SBLB1, respectively, in response to the selection signal SEL1.

The first and second sense amplifiers 214 and 216 may be the well known voltage sense amplifiers as shown in FIG. 7.

Accordingly, the structure and operation of the voltage sense amplifiers will not be described again in great detail for the sake of brevity. Also, the selectors 218 and 220 are the same as described above with respect to FIG. 7 and will not be described again for the sake of brevity.

During a read operation from, for example, a first memory array portion 701-1, the dummy word lines DWL and equalization control signal lines PVEQ of the first memory array portion 701-1 are not enabled but one of the word lines WL is enabled. The bit line selector 702-R is controlled to connect the bit line BL carrying the read data with the intermediate bit line IBL based on the bit line selection signal BLS as previously discussed with respect to other embodiments.

The dummy word lines DWL and equalization control signal lines PVEQ of the adjacent second memory array portion 701-2, however, may be enabled. As a result, the "1" and the "0" stored by the dummy memory cells DMC are averaged and output on the bit lines BL0, BL1, etc. of the second memory array portion 701-2 as a reference voltage. The bit line selector 702-L may receive the same bit line selection signal BLS as the bit line selector 702-R, and connects a bit line BL with the intermediate bit line IBL. However, the bit line BL is carrying the reference voltage, so the reference voltage appears on the intermediate bit line IBL of the bit line selector 702-R.

The controls signals of this embodiment may be the same as illustrates in FIG. 8. Accordingly, the difference between the voltage of the read data and the reference voltage is sensed and amplified by one of the first and second sense amplifiers 214 and 216. Namely, the voltage of the read data is supplied to the sensing bit line SBL of one of the first and second sense amplifiers 214 and 216, while the reference voltage is supplied to the complementary sensing bit line SBL of the one of the first and second sense amplifiers 214 and 216.

Accordingly, the concepts of the invention may be applied to an open bit line structure, and still obtain advantages such as reduced access time, savings in semiconductor real estate, and/or etc.

As with the embodiment of FIGS. 6-7, this embodiment is not limited to using two sense amplifiers. The number of sense amplifiers may be two or greater, but less than the number of bit lines for selection by an associated bit line selector.

Figure 13:
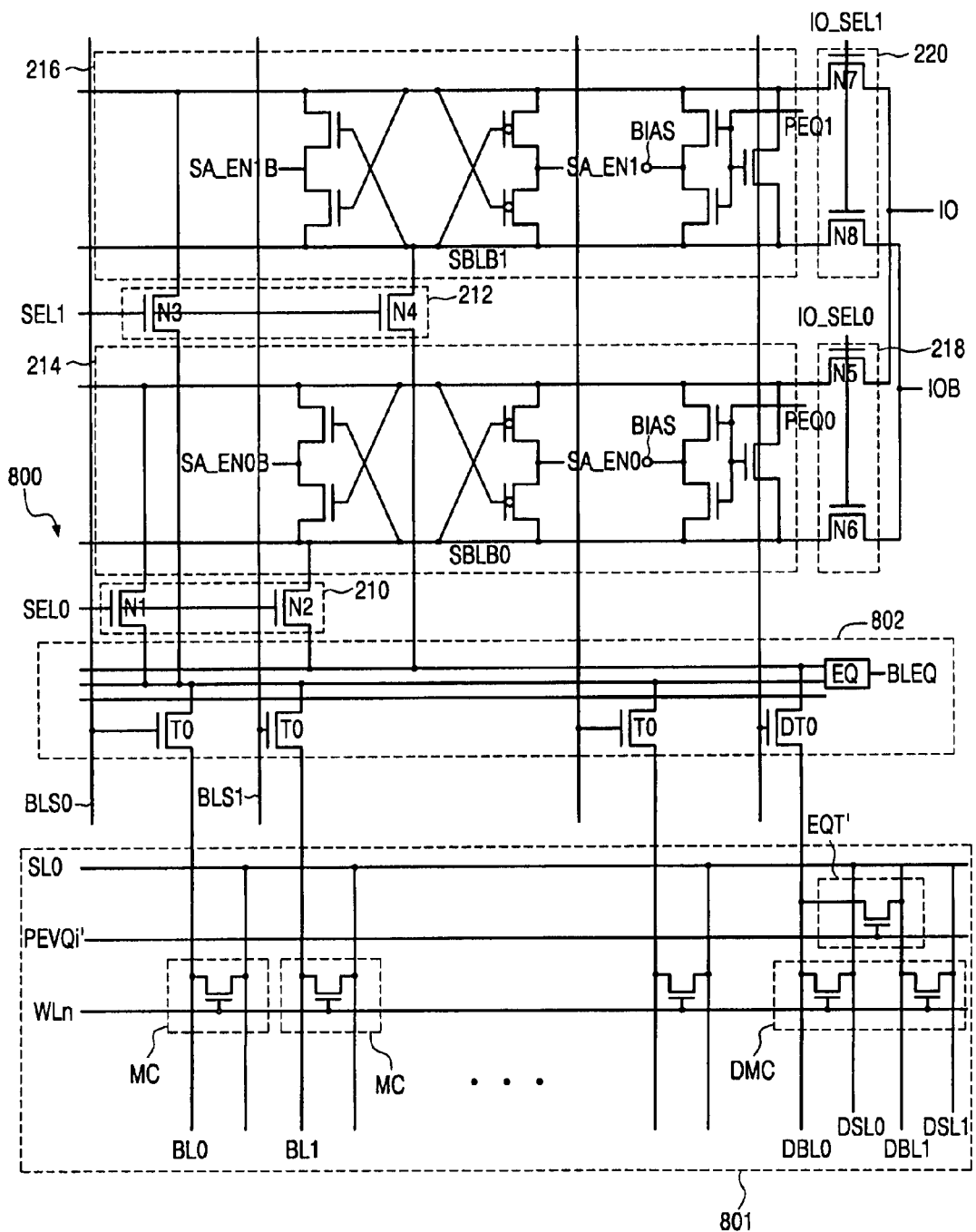
FIG. 13 illustrates a still further example embodiment of a block in the memory array and data sensing structure of FIG. 5.

FIG. 13 illustrates a block in the memory array and sensing structure 200 of FIG. 5 according to a further embodiment. In this embodiment, the memory array has an open bit line structure. As shown, the block includes a memory array portion 801. The memory array portion 801 includes a plurality of word lines WL intersecting with a plurality of bit lines BL and source lines SL. The plurality of bit lines BL and source lines SL are in parallel. Memory cells MC are formed at intersections of the word lines WL and the bit lines BL. The memory array portion 801 employs capacitor-less memory cells MC that may have the same structure as described previously with respect to FIG. 3; namely, floating body cells may be employed. In particular, the memory array portion 801 employs an open bit line structure for storing data. Namely, unlike the embodiment of FIG. 6, there are no complementary cells FNB, complementary bit lines and complementary source lines. Each memory cell MC is a floating body cell or MISFET with a gate connected to a word line WL, a source connected to a source line SL and a drain connected to a bit line BL.

The memory array portion 801 includes memory cells MC arranged in columns and rows, the number of each of which being a matter of design choice. Each row of memory cells is associated with a word line WL0, WL1, etc. Each column of memory cells MC is associated with a bit line BL and a source line SL.

Furthermore, each memory array portion 801 includes two columns of dummy cells DMC formed at intersections of the word lines with dummy bit lines DBL0 and DBL1. The dummy memory cells DMC are connected to the dummy bit lines DBL0 and DBL1, word lines, and dummy source lines DSL0 and DSL1, in the same manner as the memory cells MC. The dummy source lines DSL0 and DSL1 are connected to a source power line. The dummy memory cells DMC connected to the even numbered dummy bit line DBL0 etc. store a "1", and the dummy memory cells DMC connected to the odd numbered bit line DBL1 store a "0". It will be appreciated that the opposite arrangement may be employed. Still further, an equalization transistor EQT' connects the odd numbered bit line DBL1 with the even numbered bit line DBL0, and the equalization transistor EQT' is connected to a respective equalization control signal line PVEQ'. The row decoder 204 controls the equalization control signal lines PVEQ's.

During a write operation, the equalization control signal lines PVEQ' are disabled; for example, a logic low voltage (e.g., ground) is applied to these lines. During a read operation from, for example, the memory array portion 801, the word line WL including the memory cell MC being read is enabled. As a result, the data stored in the dummy memory cells DMC associated with that word line WL are also read. And, the equalization transistor EQT' associated with the memory array portion 800-1 is enabled. As a result, the "1" and the "0" stored by the dummy memory cells DMC are averaged and output on the dummy bit lines DBL0 and DBL1 of the memory array portion 801 as a reference voltage.

FIG. 13 also illustrates the data sense circuit in detail. As shown, a bit line selector 802 includes a transistor T0 associated with each bit line BL. Each transistor T0 selectively connects the associated bit line BL to an intermediate bit line IBL based on a respective bit line selection signal BLS from the column decoder 206. The bit line selector 802 also includes a transistor DT0 associated with the even numbered dummy bit line DBL0. However, it will be understood the transistor DT0 may, instead, be associated with the odd number dummy bit line DBL1. The transistor DT0 selectively connects the dummy bit line DBL0 to a complementary intermediate bit line IBLB in response to a dummy bit line selection signal DBLS from the column decoder 206. Accordingly, during a read operation, the read data appears on the intermediate bit line IBL, and the reference voltage appears on the complementary intermediate bit line IBLB. The bit line selector 802 also includes an equalizing circuit EQ that equalizes the voltages on the intermediate and complementary intermediate bit lines IBL and IBLB in response to an equalization signal BL EQ as described above with respect to the bit line selector 208 of FIG. 7.

As further shown, the selectors 210 and 212 are connected to the intermediate bit line IBL and complementary intermediate bit line IBLB in the same manner as described above with respect to FIG. 7. Further, the selectors 210 and 212, the sense amplifiers 214 and 216, and the selectors 218 and 220 are connected in the same manner as described above with respect to FIG. 7.

Still further, the selectors 210, 212, 218 and 220 and the sense amplifiers 214 and 220 may be operated in the same manner as described above with respect to FIG. 7. Namely, the same control signals as illustrated in FIG. 8 may be applied to the embodiment of FIG. 13. And, as will be realized with respect to the above description, in addition to the control signals of FIG. 8, the equalization signal PEVQ' will be enabled along with the word line WL. Accordingly, read data and a reference voltage will be respectively applied to the sensing bit line SBL and complementary sensing bit line SBLB of one of the sense amplifiers 214 and 216. In view of the above, a detailed description of the read operation will not be repeated. Furthermore, it will be appreciated that the advantages, alternative embodiments, and/or modifications to embodiments that are applicable to the embodiment of FIG. 7 are equally applicable to the embodiment of FIG. 13.

Figure 14:
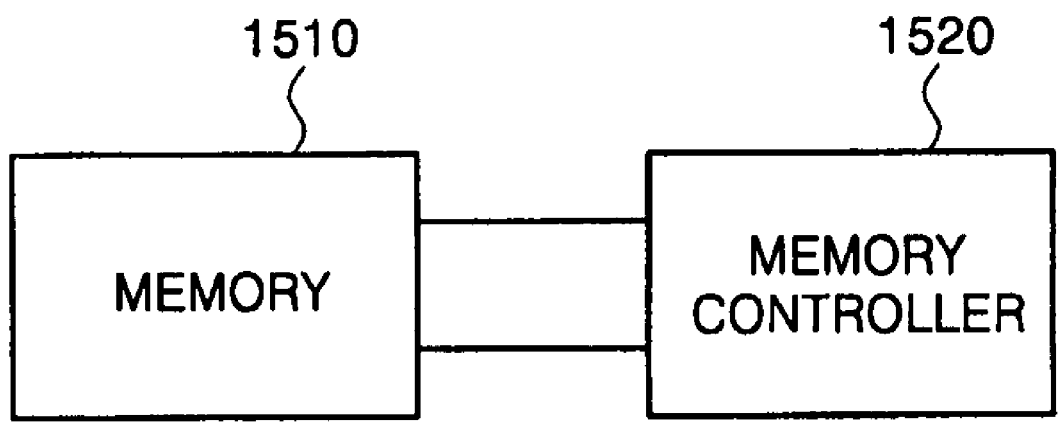
FIG. 14 illustrates an additional example embodiment employing a semiconductor memory.

FIG. 14 illustrates another embodiment. As shown, this embodiment includes a memory 1510 connected to a memory controller 1520. The memory 1510 may be any of the semiconductor memory devices discussed above. The memory controller 1520 supplies the input signals for controlling operation of the memory 1510. For example, in the case of the semiconductor memory device of FIG. 5, the memory controller 1520 supplies the command CMD and address signals. It will be appreciated that the memory controller 1520 may control the memory 1510 based on received control signals (not shown).

The invention being thus described, it will be obvious that the same may be varied in many ways. Such variations are not to be regarded as a departure from the invention, and all such modifications are intended to be included within the scope of the invention.

We claim:

1. A semiconductor integrated circuit, comprising:
a plurality of word lines;
a plurality of bit lines intersecting with the plurality of word lines;
a plurality of memory cells formed at intersections of and connected to the plurality of word lines and the plurality of bit lines, each of the plurality of memory cells being a floating body cell;
a bit line selecting circuit configured to selectively connect each of the plurality of bit lines to an output bit line;
a plurality of sense amplifiers, the plurality of sense amplifiers being greater than one and less than the plurality of bit lines in number; and
a sense amplifier switching structure configured to selectively connect each of the plurality of sense amplifiers to the output bit line.

2. The circuit of claim 1, wherein the plurality of sense amplifiers number two.

3. The circuit of claim 2, wherein the sense amplifier switching structure includes a switch associated with each of the plurality of sense amplifiers, and each switch selectively connecting the associated sense amplifier with the output bit line.

4. The circuit of claim 3, further comprising:
an output switching structure including an output switch associated with each sense amplifier, each switch selectively connecting an output of the associated sense amplifier to an output line.

5. The circuit of claim 2, further comprising:
a controller configured to control operation of the sense amplifier switching structure.

6. The circuit of claim 5, wherein the controller is configured to control the sense amplifier switching structure such that the two sense amplifiers are alternately connected to the output bit line during consecutive access of the plurality of memory cells.

7. The circuit of claim 5, wherein the controller is configured to control the sense amplifier switching structure such that a same sense amplifier is not used for two consecutive access operations of the plurality of memory cells.

8. The circuit of claim 5, wherein
each of the plurality of sense amplifiers undergoes an equalization operation after a sense operation; and
the controller controls the sense amplifier switching structure such that one of the sense amplifiers is selected while another of the sense amplifiers undergoes the equalization operation.

9. The circuit of claim 1, wherein the plurality of sense amplifiers number four.

10. The circuit of claim 9, wherein the sense amplifier switching structure includes a switch associated with each of the plurality of sense amplifiers, each switch selectively connecting the associated sense amplifier with the output bit line.

11. The circuit of claim 10, further comprising:
an output switching structure including an output switch associated with each sense amplifier, each switch selectively connecting an output of the associated sense amplifier to an output line.

12. The circuit of claim 9, further comprising:
a controller controlling operation of the sense amplifier switching structure.

13. The circuit of claim 12, wherein the controller is configured to control the sense amplifier switching structure such that the four sense amplifiers are alternately connected to the output bit line during consecutive access of the plurality of memory cells.

14. The circuit of claim 12, wherein the controller is configured to control the sense amplifier switching structure such that a same sense amplifier is not used for two consecutive access operations of the plurality of memory cells.

15. The circuit of claim 12, wherein
each of the plurality of sense amplifiers undergoes an equalization operation after a sense operation; and
the controller controls the sense amplifier switching structure such that one of the sense amplifiers is selected while another of the sense amplifiers undergoes the equalization operation.

16. The circuit of claim 1, wherein the sense amplifier switching structure includes a switch associated with each of the plurality of sense amplifiers, each switch selectively connecting the associated sense amplifier with the output bit line.

17. The circuit of claim 1, further comprising:
an output switching structure including an output switch associated with each sense amplifier, each switch selectively connecting an output of the associated sense amplifier to an output line.

18. The circuit of claim 1, further comprising:
a controller controlling operation of the sense amplifier switching structure.

19. The circuit of claim 18, wherein the controller is configured to control the sense amplifier switching structure such that the plurality of sense amplifiers are alternately connected to the output bit line during consecutive access of the plurality of memory cells.

20. The circuit of claim 18, wherein the controller is configured to control the sense amplifier switching structure such that a same sense amplifier is not used for two consecutive access operations of the plurality of memory cells.

21. The circuit of claim 18, wherein
each of the plurality of sense amplifiers undergoes an equalization operation after a sense operation; and
the controller controls the sense amplifier switching structure such that one of the sense amplifiers is selected while another of the sense amplifiers undergoes the equalization operation.

22. The circuit of claim 1, wherein the plurality of bit lines, the plurality of word lines and the plurality of memory cells form a twin cell memory structure.

23. The circuit of claim 1, wherein the plurality of bit lines, the plurality of word lines and the plurality of memory cells form an open bit line structure.

24. A semiconductor integrated circuit, comprising:
a plurality of word lines;
a plurality of bit lines intersecting with the plurality of word lines;
a plurality of memory cells formed at intersections of and connected to the plurality of word lines and the plurality of bit lines, each of the plurality of memory cells being a floating body cell;
a bit line selecting circuit configured to selectively connect each of the plurality of bit lines to an output bit line;
a plurality of sense amplifiers, the plurality of sense amplifiers being greater than one and less than the plurality of bit lines in number;
a sense amplifier switching structure configured to selectively connect each of the plurality of sense amplifiers to the output bit line; and
an enabling structure configured to disable all but one of the plurality of sense amplifiers based on an operating mode of the semiconductor integrated circuit.

25. The circuit of claim 24, wherein the enabling structure disables all but one of the plurality of sense amplifiers if a paging mode of operation is not supported.

26. The circuit of claim 25, wherein the enabling structure includes a control structure receiving selection control signals for the sense amplifier switching structure and an enabling signal, and control the sense amplifier switching structure based on the received selection control signals and enabling signal.

27. A semiconductor integrated circuit, comprising:
a plurality of word lines;
a plurality of bit lines intersecting with the plurality of word lines;
a plurality of memory cells formed at intersections of and connected to the plurality of word lines and the plurality of bit lines, each of the plurality of memory cells being a floating body cell;
a bit line selecting circuit configured to selectively output data on the plurality of bit lines; a plurality of sense amplifiers, the plurality of sense amplifiers being greater than one and less than the plurality of bit lines in number; and
a selector selectively supplying the output data from the bit line selecting circuit to one of the plurality of sense amplifiers.

28. A semiconductor integrated circuit, comprising:
a plurality of memory cell blocks, each memory cell block including,
a plurality of word lines,
a plurality of bit lines intersecting with the plurality of word lines, and
a plurality of memory cells formed at intersections of and connected to the plurality of word lines and the plurality of bit lines, each of the plurality of memory cells being a floating body cell;
at least one bit line selecting circuit associated with each memory cell block, each bit line selecting circuit configured to selectively connect one of a set of the plurality of bit lines in the associated memory cell block to an output bit line associated with the memory cell block;
a plurality of sense amplifiers associated with the memory cell block, the plurality of sense amplifiers being greater than one and less than the plurality of bit lines in the associated memory cell block in number; and
a sense amplifier switching structure associated with the memory cell block, the sense amplifier switching structure configured to selectively and independently connect each of the plurality of sense amplifiers associated with the memory cell block to the output bit line.

29. A method of sense amplifying in a semiconductor integrated circuit memory, the semiconductor integrated circuit memory including a plurality of memory cells formed at intersections of and connected to a plurality of word lines and a plurality of bit lines, each of the plurality of memory cells being a floating body cell, the method comprising:
selectively connecting one of the plurality of bit lines to an output bit line; and
selectively connecting one of a plurality of sense amplifiers to the output bit line.

30. A method of sense amplifying in a semiconductor integrated circuit memory, the semiconductor integrated circuit memory including a plurality of memory cells formed at intersections of and connected to a plurality of word lines and a plurality of bit lines, each of the plurality of memory cells being a floating body cell, the method comprising:
selectively outputting data from the plurality of bit lines; and
sense amplifying the output data such that a same sense amplifier is not used for two consecutive sense operations.

31. A method of sense amplifying in a semiconductor integrated circuit memory, the semiconductor integrated circuit memory including a plurality of memory cells formed at intersections of and connected to a plurality of word lines and a plurality of bit lines, each of the plurality of memory cells being a floating body cell, the method comprising:
selectively outputting data from the plurality of bit lines; and
controlling which of a plurality of sense amplifiers senses the selected output data, each of the sense amplifiers undergoing an equalization operation after a sense operation, and the controlling step controlling which of a plurality of sense amplifiers senses the selected output data such that one of the sense amplifiers is selected while another of the sense amplifiers undergoes the equalization operation.

* * * * *